United States Patent
Sherlekar

(10) Patent No.: US 8,631,374 B2
(45) Date of Patent: Jan. 14, 2014

(54) CELL ARCHITECTURE FOR INCREASING TRANSISTOR SIZE

(75) Inventor: Deepak D. Sherlekar, Cupertino, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 13/372,311

(22) Filed: Feb. 13, 2012

(65) Prior Publication Data
US 2012/0254817 A1    Oct. 4, 2012

Related U.S. Application Data

(60) Provisional application No. 61/469,476, filed on Mar. 30, 2011.

(51) Int. Cl.
  *G06F 17/50*    (2006.01)
(52) U.S. Cl.
  USPC ............................ 716/119; 716/118; 716/124
(58) Field of Classification Search
  USPC ......................................................... 716/119
  See application file for complete search history.

(56) References Cited

U.S. PATENT DOCUMENTS

| | | | |
|---|---|---|---|
| 5,943,243 A | 8/1999 | Sherlekar et al. | |
| 6,091,090 A | 7/2000 | Gheewala | |
| 6,617,621 B1 | 9/2003 | Gheewala et al. | |
| 6,838,713 B1 | 1/2005 | Gheewala et al. | |
| 7,069,522 B1 | 6/2006 | Sluss et al. | |
| 7,129,562 B1 | 10/2006 | Gheewala et al. | |
| 7,219,324 B1 | 5/2007 | Sherlekar et al. | |
| 7,475,379 B2 | 1/2009 | McCullen | |
| 7,603,634 B2 | 10/2009 | Sluss et al. | |
| 7,895,548 B2 | 2/2011 | Lin et al. | |
| 7,989,849 B2 | 8/2011 | Sherlekar et al. | |
| 2001/0034873 A1 | 10/2001 | Arsintescu | |
| 2005/0081176 A1 | 4/2005 | Ohshige | |
| 2006/0048079 A1 | 3/2006 | Dirks et al. | |
| 2006/0117283 A1 | 6/2006 | Katou et al. | |
| 2006/0198228 A1 | 9/2006 | Sluss et al. | |
| 2007/0157144 A1 | 7/2007 | Mai et al. | |
| 2007/0180419 A1 | 8/2007 | Sherlekar et al. | |
| 2008/0111158 A1 | 5/2008 | Sherlekar et al. | |

(Continued)

OTHER PUBLICATIONS

PCT International Search Report and Written Opinion, PCT Application No. PCT/US12/26177, Jun. 29, 2012, 12 pages.

(Continued)

*Primary Examiner* — Paul Dinh
*Assistant Examiner* — Bryce Aisaka
(74) *Attorney, Agent, or Firm* — Fenwick & West LLP

(57) ABSTRACT

A cell-based architecture for an integrated circuit that uses at least two categories of cells: cut-gate cells and breaker cells. Cut-gate cells have gates that extend from one boundary of the cell to an opposite boundary of the cell. Cut gate features are located along the boundaries of the cell to indicate locations for cutting the gates during fabrication. Instances of the cut-gate cells are arranged in abutting rows that result in the formation of continuous gate strips during the fabrication process, which are then cut into individual gates with a cut-gate mechanism. Breaker cells have gates that do not extend to the boundaries of the breaker cell. To prevent the continuous gate strips from exceeding design rule requirements, instances of breaker cells are placed at intervals between the rows of cut-gate cell instances to restrict the size of the gate strips.

25 Claims, 10 Drawing Sheets

(56) References Cited

U.S. PATENT DOCUMENTS

| | | |
|---|---|---|
| 2009/0108360 A1 | 4/2009 | Smayling et al. |
| 2009/0169832 A1* | 7/2009 | Aton .................... 428/195.1 |
| 2009/0235210 A1 | 9/2009 | Shih et al. |
| 2010/0097875 A1 | 4/2010 | Vinke et al. |
| 2010/0155783 A1 | 6/2010 | Law et al. |
| 2010/0181600 A1* | 7/2010 | Law et al. .................... 257/204 |
| 2011/0078639 A1 | 3/2011 | Lin et al. |
| 2012/0241986 A1 | 9/2012 | Sherlekar et al. |

OTHER PUBLICATIONS

PCT International Search Report and Written Opinion, PCT Application No. PCT/US12/30777, Jun. 22, 2012, 13 pages.

* cited by examiner

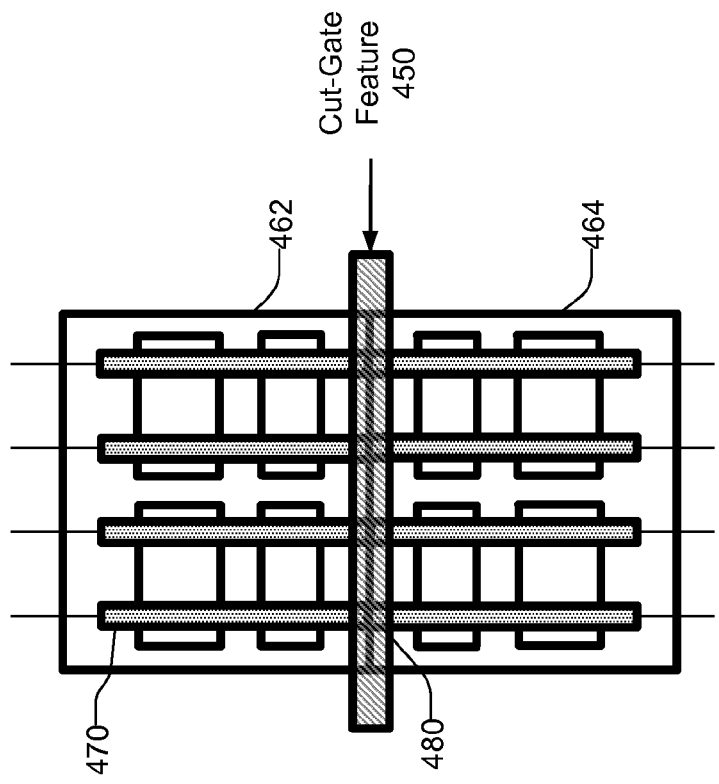
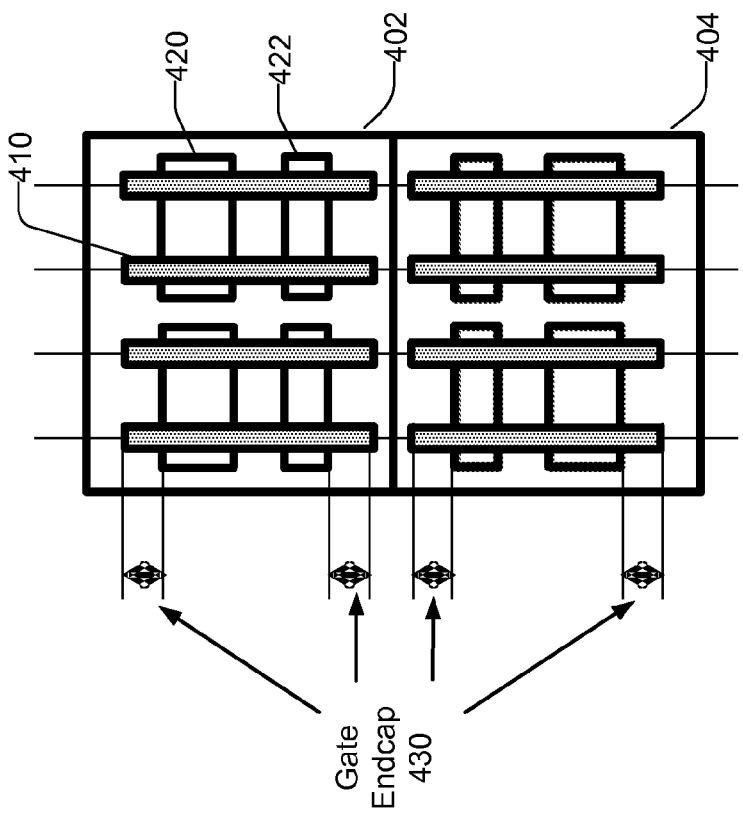
FIG. 4A (prior art)
FIG. 4B (prior art)

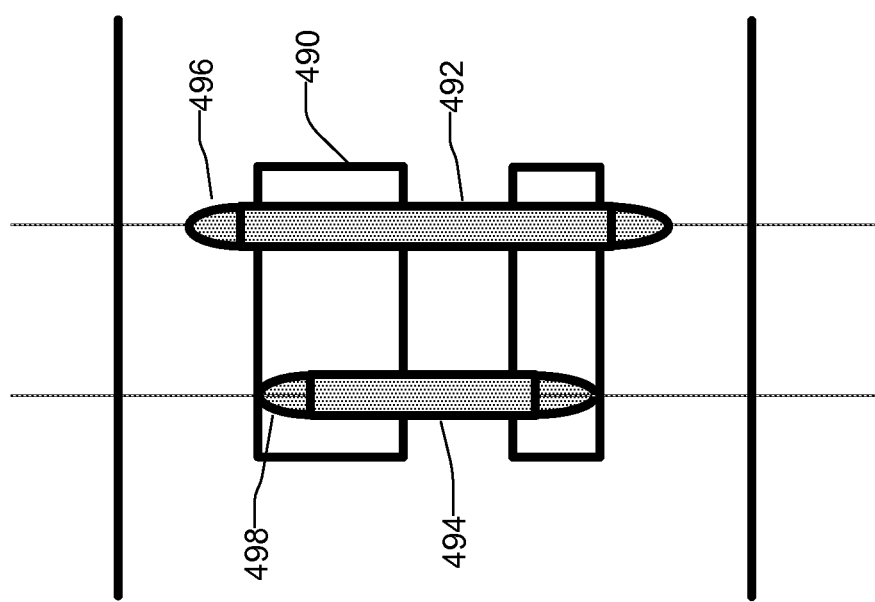

CELL ARCHITECTURE FOR INCREASING TRANSISTOR SIZE

CROSS-REFERENCE TO RELATED APPLICATIONS

This application claims priority under 35 U.S.C. §119(e) to U.S. Provisional Patent Application Ser. No. 61/469,476, "Cell Architecture for Increasing Transistor Size," filed Mar. 30, 2011, which is incorporated herein by reference in its entirety.

BACKGROUND

1. Field of Art

The disclosure generally relates to the field of electronic design automation (EDA), and more specifically to maximizing transistor size in cell based designs.

2. Description of the Related Art

Computer-aided cell-based design has been developed for quickly designing large scale ICs such as application specific integrated circuits (ASICs) and gate arrays. The cell is a circuit that has been pre-designed and pre-verified as a building block. Design technologies known as standard cell and gate array use different types of such building blocks. In a standard cell design, each distinct cell in a library may have unique geometries of active, gate, and metal levels. With gate arrays however, each cell shares the same building block, called a core cell that includes fixed active and gate level geometries. Different gate array cells are implemented using only metal interconnections between the active and gate elements of one or more core cells. Examples of a standard cell or gate array cell include an inverter, a NAND gate, a NOR gate, a flip flop, and other similar logic circuits.

During the process of designing an integrated circuit, a designer may select particular cells from a library of cells and use them in a design. The library includes cells that have been designed for a given integrated circuit (IC) manufacturing process, such as complementary metal oxide semiconductor (CMOS) fabrication. The cells generally have a fixed height but a variable width, which enables the cells to be placed in rows. Cells do not change from one design to the next, but the way in which they are interconnected will, to achieve the desired function in a given design. By being able to select the cells from the library for use in the design, the designer can quickly implement a desired functionality without having to custom design the entire integrated circuit from scratch. Thus, the designer will have a certain level of confidence that the integrated circuit will work as intended when manufactured without having to worry about the details of the individual transistors that make up each cell.

Because a designer will use many copies (called instances) of a cell in a particular design, it is important to optimize the cells to be as compact as possible. Otherwise, any inefficiency will be replicated with every instance of the standard cell in the design. However, the cells must also be designed so that the resulting design complies with numerous design rules. Design rules restrict the placement of objects (e.g., metal, vias, gates) in an integrated circuit design to account for inevitable variations during the fabrication process. Thus, the minimum size of a cell may be limited in order to comply with certain design rules.

SUMMARY

Embodiments of the present disclosure relate to an efficient cell-based architecture for an IC. In one embodiment, an IC is fabricated from a representation of the IC. The representation includes a first plurality of adjacent cell instances forming a first gate strip extending continuously across the first plurality of cell instances. Each cell instance in the first plurality of cell instances has cut gate features located along opposing boundaries of the cell instance to indicate locations for cutting the first gate strip during fabrication of the IC. The representation includes a breaker cell instance that includes a gate. Both ends of the gate are located within an interior of the breaker cell instance and offset from the boundaries of the breaker cell instance. The gate of the breaker cell instance is collinear with and separated from the first gate strip. The use of cut gate features in the first cell instances results in a more efficient layout for the IC, while the breaker cell instance prevents the gate strip from violating design rules.

In one embodiment, the representation of the IC may also include a second plurality of cell instances forming a second gate strip extending continuously across the second plurality of cell instances. Each cell instance in the second plurality of cell instances has a cut gate features located along opposing boundaries of the cell instance to indicate locations for cutting the second gate strip during fabrication of the IC. The first gate strip, the gate of the breaker cell instance, and the second gate strip are collinear. Additionally, the gate of the breaker cell instance is separated from and located between the first gate strip and second gate strip. In one embodiment, a non-transitory machine readable medium stores the representation of the IC.

In one embodiment, a computer implemented method is disclosed for generating a representation of the IC. A breaker cell instance is arranged into the representation. The breaker cell instance has a gate. Both ends of the gate are located within an interior of the breaker cell instance and offset from the boundaries of the breaker cell instance. A first plurality of cell instances is arranged into the representation to form a first gate strip that is collinear with and separated from the gate of the breaker cell instance. The first gate strip extends continuously across the first plurality of cell instances. Each cell instance in the first plurality of cell instances has cut gate features located along opposing boundaries of the cell instance indicating locations for cutting the first gate strip during fabrication of the IC.

In one embodiment, a non-transitory machine readable medium stores at least one cell library for use in designing an IC. The at least one cell library comprises a plurality of first cells. Each first cell includes a gate extending at least from a first boundary of the cell to a second boundary of the cell that is opposite to the first boundary. Each first cell includes cut gate features located along the first and second cell boundaries indicating locations for cutting the gate during fabrication of the IC. The at least one cell library also comprises a breaker cell. The breaker cell includes a gate. Both ends of the gate are located within an interior of the breaker cell and offset from the boundaries of the breaker cell.

BRIEF DESCRIPTION OF DRAWINGS

The disclosed embodiments have other advantages and features which will be more readily apparent from the detailed description, the appended claims, and the accompanying figures (or drawings). A brief introduction of the figures is below.

FIG. 4A illustrates conventional cells with large gate end caps.

FIG. 4B illustrates conventional cells with smaller end caps that implement a cut gate feature.

FIG. 4C illustrates an appearance of gates in an IC after the IC is fabricated.

DETAILED DESCRIPTION

Figure 1:
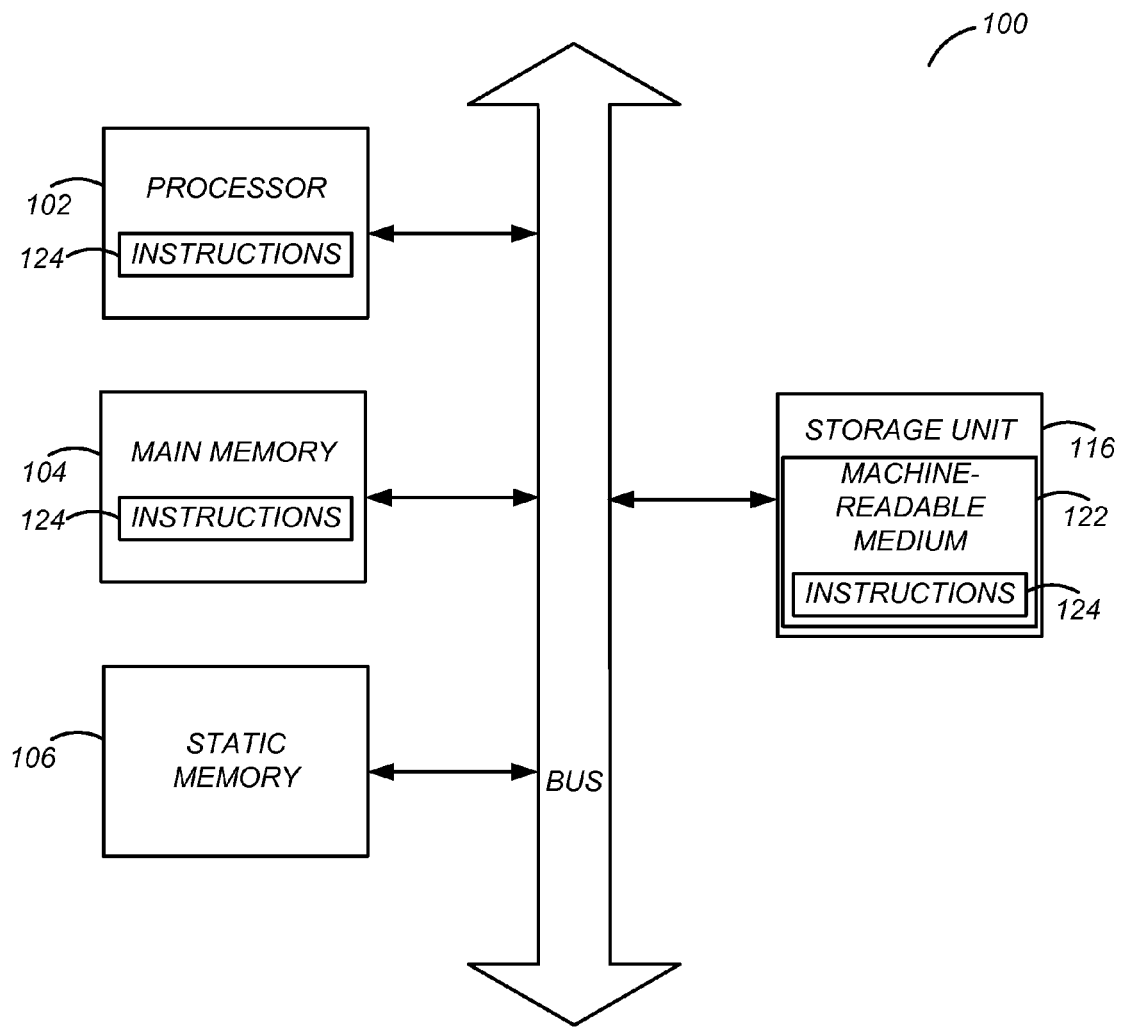
FIG. 1 illustrates one embodiment of components of an example machine able to read instructions from a machine-readable medium and execute them in a processor (or controller).

The Figures (FIGS.) and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Reference will now be made in detail to several embodiments, examples of which are illustrated in the accompanying figures. It is noted that wherever practicable similar or like reference numbers may be used in the figures and may indicate similar or like functionality. The figures depict embodiments of the disclosed system (or method) for purposes of illustration only. Alternative embodiments of the structures and methods illustrated herein may be employed without departing from the principles described herein.

Embodiments of the present disclosure relate to cell architectures that increase transistor size in cell based designs. Two different categories of cells are used in conjunction to generate a more efficient layout representation for an integrated circuit (IC) design. One category of cell, called a "cut-gate" cell, has gates that extend at least from the top boundary of the cell to the bottom boundary of the cell. The cut-gate cell also has cut-gate features located at the top and bottom boundaries of the cell to separate the gates of the cell from the gates of cut-gate cells in abutting rows. The use of cut-gate features enables the transistors in the cut-gate cell to be larger without increasing the size of the cell, or alternatively, it allows the cut-gate cells to be smaller without reducing the size of the transistors in the cell.

Another category of cell, called a "breaker" cell, does not have gates that extend to the boundaries of the cell. Instances of cut-gate cells and breaker cells may be arranged into rows. Abutting rows of cut-gate cell instances are separated at certain intervals by a row of breaker cell instances. The breaker cell instances prevent the large gate strips created by abutting rows of cut-gate cell instances from violating design rules by restricting the size of the large gate strips. In one embodiment, the breaker cells include metal programmable cells, decoupling capacitor cells, or tap cells to provide functionality other than breaking up the gate strips. Although it is technically feasible to embody the breaker cells as empty cells, in many cases, design rules will require a certain density of features in a design, preventing the breaker cells from being empty cells.

A cell described herein refers to a predefined circuit unit or circuit element that is provided, as part of a cell library of many different types of circuit units, to an integrated circuit designer. The cell is re-used in multiple instances as needed to make up the integrated circuit. For example, a cell may be an inverter, a NAND gate, a NOR gate, a flip flop, and other similar logic circuits. Each cell has a boundary, typically consisting of four edges that form a rectangular shape. As used herein, a standard cell refers to a cell with a predefined layout that is used in conjunction with other standard cells to implement a desired functionality of an integrated circuit. Standard cells may have fixed active and gate level geometries. Standard cells have a fixed height but variable width, which allows the standard cells to be placed side by side in rows. Embodiments of this disclosure will be described with reference to standard cells, but the principles described herein are applicable to both standard cells and other cells such as gate array cells.

Computing Machine Architecture

FIG. 1 is a block diagram illustrating components of an example machine able to read instructions from a machine-readable medium and execute them in a processor (or controller). Specifically, FIG. 1 shows a diagrammatic representation of a machine in the example form of a computer system 100 within which instructions 124 (e.g., software) for causing the machine to perform any one or more of the methodologies discussed herein may be executed. In alternative embodiments, the machine operates as a standalone device or may be connected (e.g., networked) to other machines. In a networked deployment, the machine may operate in the capacity of a server machine or a client machine in a server-client network environment, or as a peer machine in a peer-to-peer (or distributed) network environment.

The machine may be a server computer, a client computer, a personal computer (PC), or any machine capable of executing instructions 124 (sequential or otherwise) that specify actions to be taken by that machine. Further, while only a single machine is illustrated, the term "machine" shall also be taken to include any collection of machines that individually or jointly execute instructions 124 to perform any one or more of the methodologies discussed herein.

The example computer system 100 includes a processor 102 (e.g., a central processing unit (CPU), a graphics processing unit (GPU), a digital signal processor (DSP), one or more application specific integrated circuits (ASICs), a main memory 104, a static memory 106, and a storage unit 116 which are configured to communicate with each other via a bus 108. The storage unit 116 includes a machine-readable medium 122 on which is stored instructions 124 (e.g., software) embodying any one or more of the methodologies or functions described herein. The instructions 124 (e.g., software) may also reside, completely or at least partially, within the main memory 104 or within the processor 102 (e.g., within a processor's cache memory) during execution thereof by the computer system 100, the main memory 104 and the processor 102 also constituting machine-readable media.

While machine-readable medium 122 is shown in an example embodiment to be a single medium, the term "machine-readable medium" should be taken to include a single medium or multiple media (e.g., a centralized or distributed database, or associated caches and servers) able to store instructions (e.g., instructions 124). The term "machine-readable medium" shall also be taken to include any medium that is capable of storing instructions (e.g., instructions 124)

for execution by the machine and that cause the machine to perform any one or more of the methodologies disclosed herein. The term "machine-readable medium" includes, but not be limited to, data repositories in the form of solid-state memories, optical media, and magnetic media.

Overview of EDA Design Flow

Figure 2:
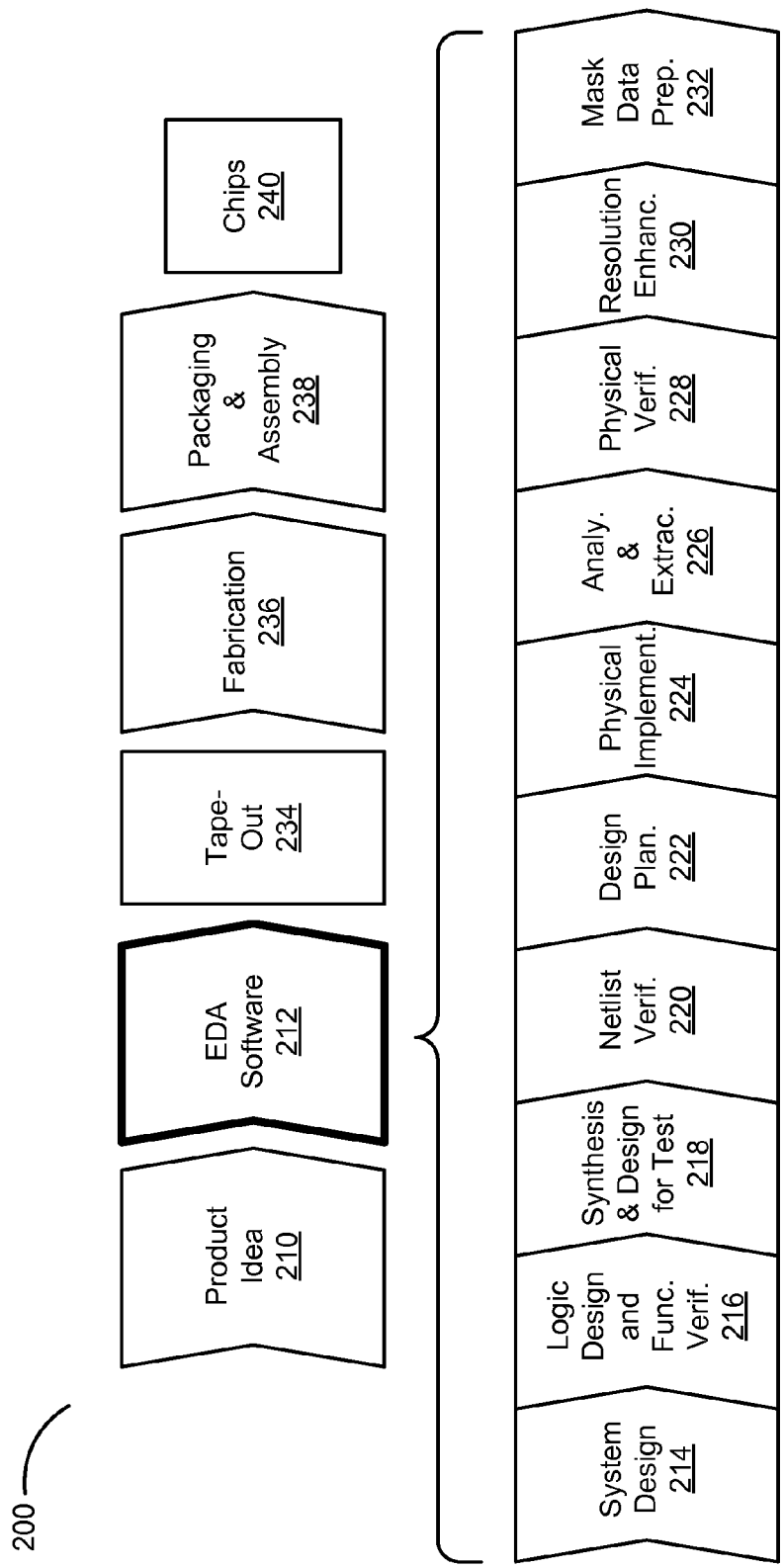
FIG. 2 is one embodiment of a flowchart illustrating various operations in the design and fabrication of an IC.

FIG. 2 is a flowchart 200 illustrating the various operations in the design and fabrication of an integrated circuit. This process starts with the generation of a product idea 210, which is realized during a design process that uses electronic design automation (EDA) software 212. When the design is finalized, it can be taped-out 234. After tape-out, a semiconductor die is fabricated 236 to form the various objects (e.g., gates, metal layers, vias) in the integrated circuit design. Packaging and assembly processes 238 are performed, which result in finished chips 240.

The EDA software 212 may be implemented in one or more computing devices such as the computer 100 of FIG. 1. For example, the EDA software 212 is stored as instructions in the computer-readable medium which are executed by a processor for performing operations 214-232 of the design flow, which are described below. This design flow description is for illustration purposes. In particular, this description is not meant to limit the present disclosure. For example, an actual integrated circuit design may require a designer to perform the design operations in a difference sequence than the sequence described herein.

During system design 214, designers describe the functionality to implement. They can also perform what-if planning to refine the functionality and to check costs. Note that hardware-software architecture partitioning can occur at this stage. Example EDA software products from Synopsys, Inc. of Mountain View, Calif. that can be used at this stage include: Model Architect®, Saber®, System Studio®, and Designware® products.

During logic design and functional verification 216, VHDL or Verilog code for modules in the circuit is written and the design is checked for functional accuracy. More specifically, the design is checked to ensure that it produces the correct outputs. Example EDA software products from Synopsys, Inc. of Mountain View, Calif. that can be used at this stage include: VCS®, Vera®, 10 Designware®, Magellan®, Formality®, ESP® and Leda® products.

During synthesis and design for test 218, VHDL/Verilog is translated to a netlist. This netlist can be optimized for the target technology. Additionally, tests can be designed and implemented to check the finished chips. Example EDA software products from Synopsys, Inc. of Mountain View, Calif. that can be used at this stage include: Design Compiler®, Physical Compiler®, Test Compiler®, Power Compiler®, FPGA Compiler®, Tetramax®, and Designware® products.

During netlist verification 220, the netlist is checked for compliance with timing constraints and for correspondence with the VHDL/Verilog source code. Example EDA software products from Synopsys, Inc. of Mountain View, Calif. that can be used at this stage include: Formality®, Primetime®, and VCS® products.

During design planning 222, an overall floor plan for the chip is constructed and analyzed for timing and top-level routing. Example EDA software products from Synopsys, Inc. of Mountain View, Calif. that can be used at this stage include: Astro® and IC Compiler® products.

During physical implementation 224, the placement (positioning of circuit elements) and routing (connection of the same) occurs. Example EDA software products from Synopsys, Inc. of Mountain View, Calif. that can be used at this stage include: the Astro® and IC Compiler® products.

During analysis and extraction 226, the circuit function is verified at a transistor level, which permits refinement. Example EDA software products from Synopsys, Inc. of Mountain View, Calif. that can be used at this stage include: Astrorail®, Primerail®, Primetime®, and Star RC/XT® products.

During physical verification 228, the design is checked to ensure correctness for: manufacturing, electrical issues, lithographic issues, and circuitry. Example EDA software products from Synopsys, Inc. of Mountain View, Calif. that can be used at this stage include the Hercules® product.

During resolution enhancement 230, geometric manipulations of the layout are performed to improve manufacturability of the design. Example EDA software products from Synopsys, Inc. of Mountain View, Calif. that can be used at this stage include: Proteus®, Proteus®AF, and PSMGED® products.

During mask-data preparation 232, the 'tape-out' data for production of masks to produce finished chips is provided. Example EDA software products from Synopsys, Inc. of Mountain View, Calif. that can be used at this stage include the CATS® family of products.

Embodiments of the present disclosure can be used during one or more of the above-described stages. Specifically, in some embodiments the present disclosure can be used in EDA software 212 that includes operations between design planning 222 and physical implementation 224.

Gate Endcaps

Figure 3:
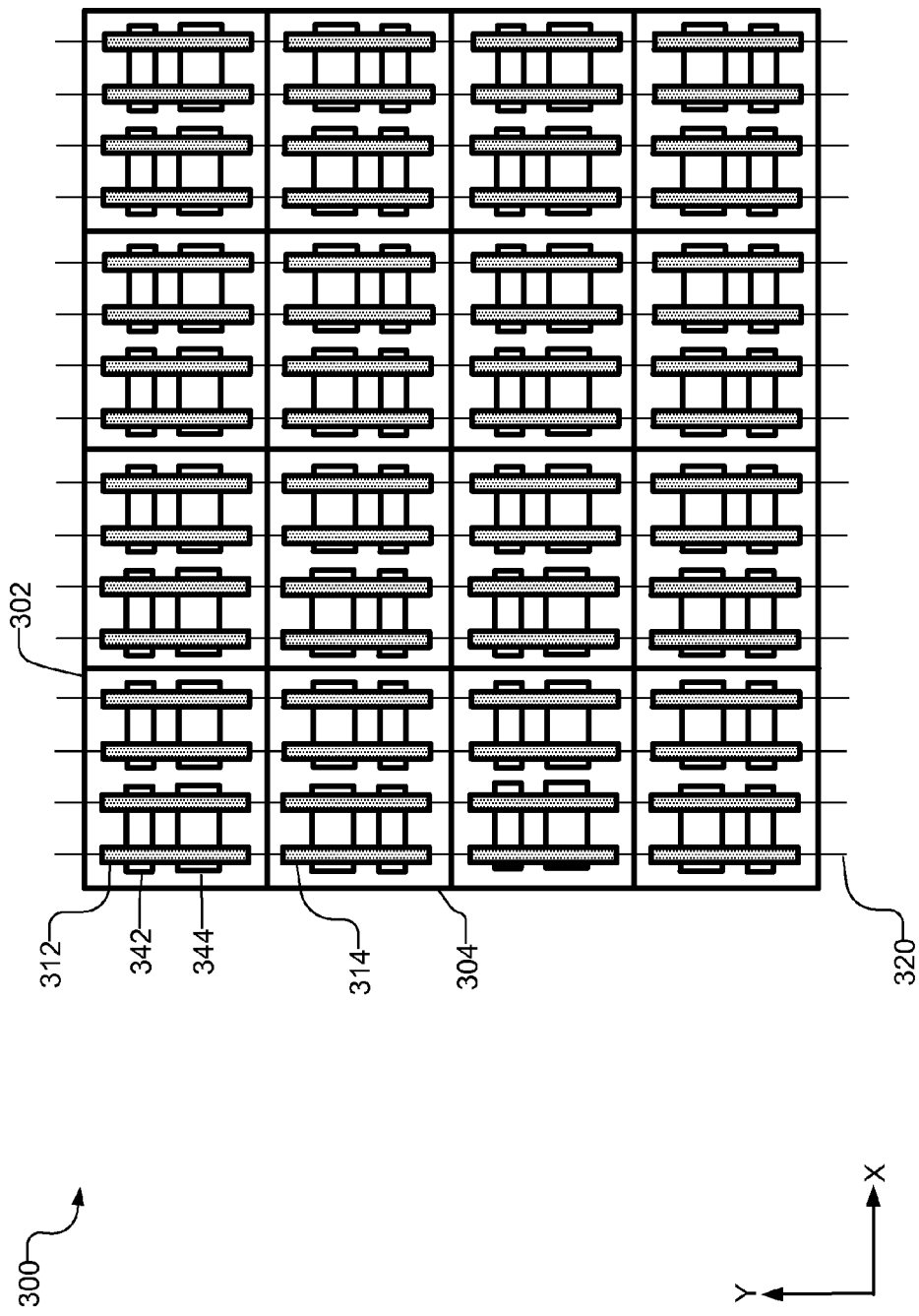
FIG. 3 illustrates a block of conventional standard cells with large gate endcaps.

FIG. 3 illustrates a block 300 of conventional standard cell instances with large gate endcaps. The block 300 may represent, for example, a portion of an IC layout generated by the EDA software 212 that is eventually used to fabricate an IC chip. As shown, the block 300 includes multiple instances of standard cells (e.g., 302 and 304) organized into a 4×4 matrix. The block 300 has four rows, and each row includes four standard cell instances. Standard cells are typically of a fixed height but variable width, which allows instances of the cells to be neatly placed in fixed-height rows. For ease of illustration, the standard cells instances in FIG. 3 are all of the same width. The standard cell instances 300 are meant to represent any generic standard cells (e.g., Inverter, NAND, NOR, flops, etc), although all the details of these cells, such as interconnections between the gates of the standard cells, are not shown in these figures. Additionally, the block 300 may contain a mix of different types of standard cells.

Each cell instance includes a plurality of gates (e.g., 312 and 314) running in a single direction (e.g., the Y direction). When fabricated, the gates may be formed from a material such as polycrystalline silicon or metal. The gates are spaced at a fixed pitch, meaning that the center to center distance from one gate to the next in the X direction is the same. Because of the fixed pitch spacing, gates in the block are collinear. For example, gate 312 and gate 314 are aligned along a single column 320.

Each cell instance also includes active/diffusion regions (e.g., 342 and 344) that are located in a substrate of the cell. For example, each cell instance may have a p-diffusion region 342 and n-diffusion region 344. Alternatively, the diffusion regions may be swapped so that region 342 is the n-diffusion and region 344 is the p-diffusion. The gates (e.g., 312) of each cell instance form transistors by extending over the active/diffusion regions (e.g., 342 and 344). The portions of the gates (e.g., 312) that extend past the diffusion regions (e.g., 342) are known as gate end caps. Gate end caps are described in greater detail below with reference to FIGS. 4A-C.

FIG. 4A illustrates conventional cells from FIG. 3 that have large gate end caps. As shown, two standard cells 402 and 404 are placed in different rows but along a single column. Each cell has four gates (e.g., 410), and each gate forms a transistor by extending past the active/diffusion regions (e.g., 420 and 422). The portion of the gate that extends past the active/diffusion regions in the layout of an IC is known as the end cap 430, and the size of the end cap 430 must be greater than or equal to a "minimum end cap" size that is specified by a design rule known as the gate end cap rule. For example, the gate end cap rule for a certain manufacturing process may require the end caps 430 to be at least 10 nm in length.

The minimum end cap is needed because, during modern fabrication processes, the ends 430 of the gate features 410 will be shortened or rounded by lithographic distortions as the gates 410 are being formed on the substrate. For example, FIG. 4C illustrates an appearance of gates in an IC after the IC is fabricated. Two gates 492 and 494 are shown extending across an active region 490. Both gates 492 and 494 are rounded at their ends 496 and 498. The layout representation of gate 494 did not have a sufficient end cap. Thus, the end 498 of gate 494 is recessed and rounded inside the active region 490. The resulting gate 494 is smaller than desired and may not effectively control the current following across the active region 490. On the other hand, the layout of gate 492 was designed with a large end cap. Thus, when the end 496 of the gate 492 is rounded during the manufacturing process, the portion of the gate 492 extending across the active region 490 is not affected.

Referring back to FIG. 4A, although end caps 430 help address lithographic distortions in the manufacturing process, having large end caps in cell based designs is undesirable because it reduces the size of the transistors in the cells. The size of a transistor is generally determined by the amount of overlap between the gate (e.g., 410) and the active/diffusion regions (e.g., 420 and 422). Larger transistors will have higher drive strength, whereas smaller transistors will have lower drive strength. Large end cap 430 requirements reduce the maximum size of the overlap between the gate 410 and the diffusion regions 420 and 422, thereby limiting the maximum size and drive strength of the cell transistors.

An alternative technique for fabricating transistors with smaller end-caps is called "cut-gate", which is sometimes referred to as cut-poly. FIG. 4B illustrates two conventional cell instances 462 and 464 that include a cut gate-feature 450 and smaller end caps. The cells instance in FIG. 4B are similar to the cell instances in FIG. 4A, however these cell instances implement a cut-gate feature 450 on one side of the cell. Cell instance 464 includes a cut-gate feature 450 on the top of the cell, but not the bottom. Cell instance 462 includes a cut-gate feature 450 on the bottom of the cell, but not the top.

The cut-gate feature 450 indicates a location for where the gates should be cut during fabrication of an integrated circuit. In other words, the cut-gate technique allows a series of collinear gates to be fabricated with a single gate strip that is then cut into individual gates. In one embodiment, during the fabrication of an integrated circuit that includes the cells of FIG. 4B, a large gate strip (e.g. 470) is formed that extends across both cells 462 and 464. A mask is made to cover both cells 462 and 464. An opening in the mask is made that corresponds to the location of the cut-gate feature 450 to expose portions (e.g. 480) of the gate strips (e.g. 470) for cutting. A cut is then performed to remove the portions (e.g., 480) of the gate strips (e.g., 470) exposed through the opening.

Fabricating gates with a cut-gate mechanism maintains better control over the gate size without requiring a large gate end cap. The minimum end cap requirement for gates created using the cut-gate process is thus smaller than the minimum end cap requirement for gates created without using the cut-gate process. Because the end caps are smaller, the transistors in the cell instances can be larger. In other words, the overlaps between the gates and active/diffusion regions in FIG. 4B are larger than the overlaps in FIG. 4A, resulting in transistors with stronger drive strengths without increasing the size of the cell. Alternatively, the size of the cells can be reduced while maintaining the same transistor size (not shown).

One problem with fabricating gates with the cut-gate technique is that many manufacturing processes set a maximum limit on the size of a continuous gate feature that can be formed before the gate feature is cut into smaller gates with the cut-gate technique. The maximum limit on the size of the gate feature is referred herein as the "maximum uncut gate size." The maximum uncut gate size effectively sets a limit on the number of gates that can be cut from a single gate feature using a cut-gate technique. To avoid exceeding the maximum uncut gate size, conventional standard cells, such as those shown in FIG. 4B, are configured with a cut-gate feature 450 only on one side of cells. This prevents the size of the gates from growing beyond the maximum uncut gate size when many cell instances are aligned in a column. For example, in FIG. 4B, cell instance 462 has a cut gate feature 450 at the bottom boundary of the cell instance 462, but not at the top boundary of the cell instance 462. As a result, the gates of the cell instance 462 do not extend all the way to the top boundary of the cell instance 462, but they do extend all the way to the bottom boundary of the cell instance 462. Similarly, cell instance 464 has a cut gate feature 450 at the top boundary of the cell instance 464, but not at the bottom boundary of the cell instance 464.

Cut-Gate Cells and Breaker Cells

Figure 5:
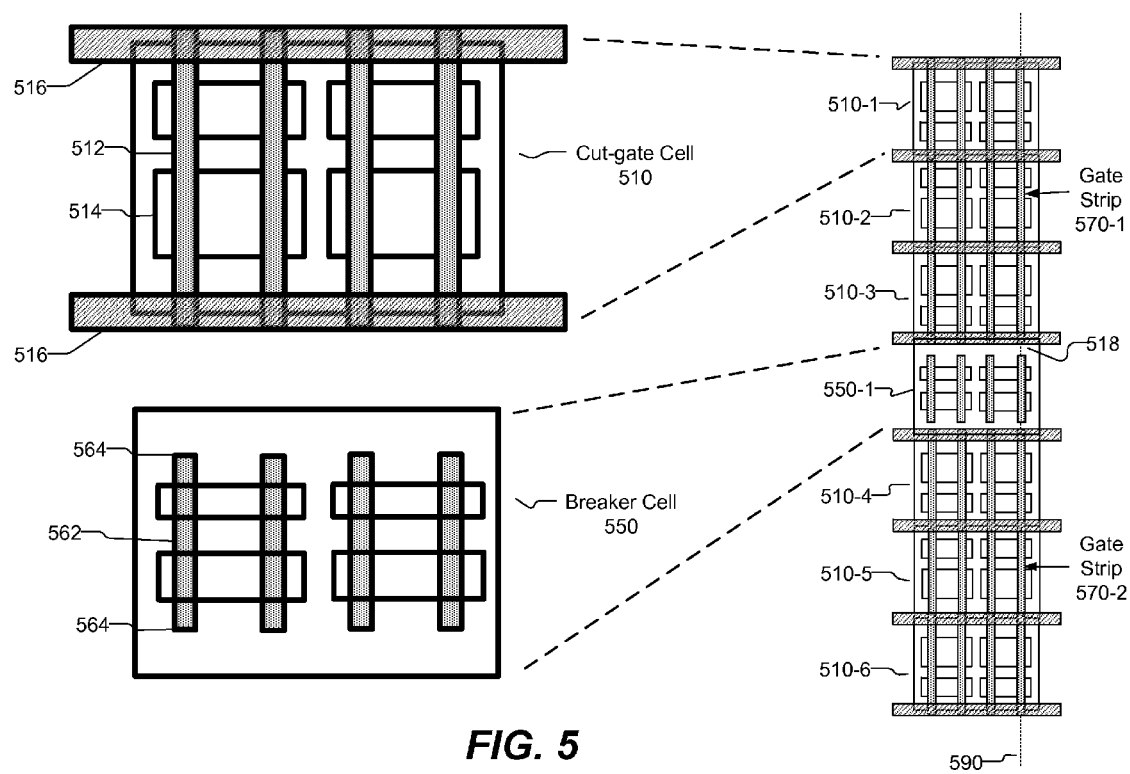
FIG. 5 illustrates one embodiment of a standard cell configuration with cut-gate cells and breaker cells.

FIG. 5 illustrates one embodiment of a standard cell configuration with cut-gate cells and breaker cells. Two different categories of standard cells are shown on the left side of FIG. 5. A first category of standard cell is a "cut-gate" cell 510. Most of the cells in a cell library and the instances of those cells in an integrated circuit design may have a configuration that resembles the cut-gate cell 510. A second category of standard cell is a "breaker" cell 550. The right side of the FIG. 5 shows how instances of the cut-gate cells and breaker cells can be arranged in a layout of an integrated circuit. As shown, three cut-gate cell instances 510-1, 510-2, 510-3 are placed along a single column in different rows, and are separated from three other cut-gate cell instances 510-4, 510-5, 510-6 by a breaker cell instance 550-1.

The cut-gate cell 510 includes gates (e.g., 512) that fully extend from the bottom boundary of the cell to the top boundary of the cell across the active/diffusion regions (e.g., 514) of the cell. The gates (e.g., 512) may also extend past the top and bottom boundaries of the cell. The cut-gate cell 510 includes cut gate features 516 located along the top and bottom boundaries of the cell 510. Because the cell 510 includes two cut gate features 516, the end caps of the cut-gate cell can be reduced when compared to the conventional cells of FIGS. 4A and 4B. This allows the transistors in the cut-gate cell 510 to be larger without increasing the size of the cell 510. Alternatively, this allows the cell 510 to be shorter without affecting the size of its transistors.

Cell 510 is meant to represent any type of standard cell (e.g., NAND, NOR, Flop, inverter), although all the details of the cells are not shown in FIG. 5. The principles described herein are applicable to any type of standard cell. Furthermore, some logic functions may require a wider cell with more transistors and some logic functions may be implemented using a narrower cell with fewer transistors. In practice, a cell library may include a mix of different types of standard cells implementing different logic functions, each of which has gates 512 and cut-gate regions 516 similar to those shown in the cut-gate cell 510 of FIG. 5. Similarly, a layout that uses cells from the cell library will use a mix of different types of standard cells.

It should be noted that the data representation of a cut-gate cell 510, as stored in a standard cell library, appears slightly different than the corresponding cut-gate cell instance in the IC that is fabricated from the cut-gate cells 510. For example, FIG. 5 illustrates the data representation of a cut-gate cell 510. In a data representation of a cut-gate cell 510, the gates extend at least to the boundaries of the cell 510. Cut-gate features 516 are included in the data representation of the cell 510 to provide an indication of where the gates should be cut when the cell is actually fabricated. During fabrication, the gates will be formed so that they extend from one boundary of the cell 510 to the opposite boundary of the cell. The portions of the gates that are in the cut-gate regions 516 will then be cut-off. Thus, the final physical implementation of the cut-gate cell 510 will have gates that extend from one cut-gate region 516 to the other cut-gate region 516 on the opposite boundary of the cell 510 without actually reaching the cell boundaries.

The breaker cell 550 is a cell where the gates (e.g. 562) of the cell 550 are located entirely inside and within the boundaries of the cell 550 and do not extend all the way to the top and bottom boundaries of the cell. In other words, the ends 564 of the gates 562 are offset from the boundaries of the cell 550 and located within the interior of the cell 550. The gates of the breaker cell 550 are fabricated without using the cut-gate mechanism. As a result, a breaker cell 550 may have end caps that are greater than or equal to the minimum end cap specified by the end cap rule.

In one embodiment, the breaker cell 550 is the same height as the cut-gate cells 510. In less advantageous embodiments, the breaker cell 550 may be taller or shorter than a cut-gate cell 510, however non-uniform cell height reduces compatibility with many EDA tools 212 that require uniform cell height. To maintain compliance with design rules, the gate pitch of the breaker cell 550 may be the same as the gate pitch of the cut-gate cells 510, as is evident from the spacing between the cell gates in FIG. 5.

In one embodiment, the breaker cell 550 represents, for example, a metal programmable cell, a decoupling capacitor cell, a tap cell for connecting the substrate to a voltage potential, a logic cell (e.g., NAND, NOR), etc. In other embodiments, the breaker cell 550 may not have any gates (e.g., 562) at all, although design rules generally require the breaker cells 550 to have gates.

Because the gates 512 of a cut-gate cell 510 extend to or past the boundaries of the cut-gate cell 510, when instances (e.g. 510-1 to 510-6) of the cut-gate cells 510 are placed in abutting rows, their gates are aligned along a single column (e.g., column 590) to create large gate strips that extend continuously across multiple cell instances. For example, gate strip 570-1 extends across cell instances 510-1, 510-2 and 510-3. Gate strip 570-2 extends across cell instances 510-4, 510-5 and 510-6. The number of cut-gate cell instances 510-1 to 510-6 that can be placed in this manner is restricted by the maximum gate size rule. To prevent a configuration of cut-gate cell instances 510-1 to 510-6 from exceeding the maximum uncut gate size, a breaker cell instance 550-1 is placed between the cut-gate cell instances 510-1 to 510-6 at certain intervals to separate and limit the size of the continuous uncut gate strips 570. Additionally, the gates of the breaker cell instance 550-1 are collinearly aligned with the continuous uncut gate strips 570.

As previously mentioned, the breaker cell 550 has gates 562 that do not extend to the boundaries of the cell 550. Additionally, the gates 562 of the breaker cell 550 are designed to ensure compatibility with the gates 512 of cut-gate cells 510 when cut gate cell instances 510-3 to 510-4 are placed directly above and below the breaker cell instance 550-1. Thus, the ends (e.g. 564) of the gates 562 of the breaker cell 550 are a sufficient distance from the top and bottom boundaries of the breaker cell 550 such that, when a breaker cell instance 550-1 is placed between two cut gate cell instances (e.g., 510-3 and 510-4), the gates of the breaker cell instance 550-1 do not overlap with any portions 518 of the continuous gate strips 570 that extend into the breaker cell instance 550-1. In other words, the gates of the breaker cell instance 550-1 are separated and distinct from the long gate strips 570 of the surrounding cut gate cell instances 510-1 to 510-6. As a result, placing the breaker cell instance 550-1 between cut-gate cell instances 510-1 to 510-6 effectively breaks up any large gate strips 570 so that they do not exceed the maximum uncut gate size.

Figure 6A:
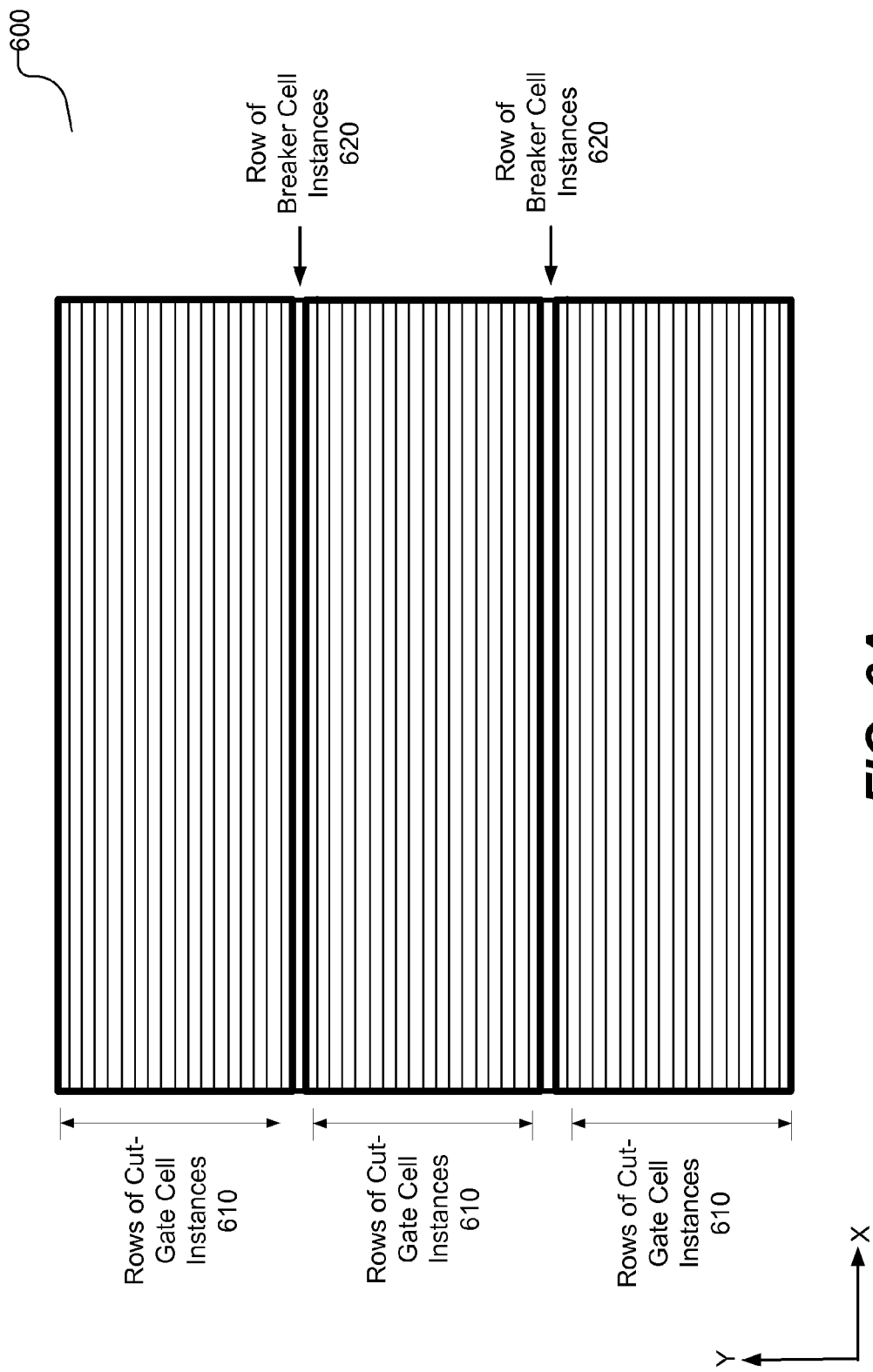
FIG. 6A illustrates one embodiment of a standard cell configuration with cut-gate cells and breaker cells arranged into rows.

FIG. 6A illustrates one embodiment of a standard cell configuration with cut-gate cell instances and breaker cell instances arranged into rows. Shown is a block 600 of cell instances that represents, for example, the layout for an entire IC or a portion of a larger IC. In one embodiment, the block 600 of cell instances is organized into rows of cut-gate cell instances 610 and rows of breaker cell instances 620. The distance between the rows of breaker cell instances is less than or equal to the maximum continuous uncut gate size. This spacing prevents the gate strips (not shown) in the rows of cut-gate cells 610 from exceeding the maximum uncut gate size during the fabrication process. In one embodiment, to minimize the overall size of the block 600, the breaker cell instances are placed so that the gate strips (not shown) created by the rows of cut-gate cell instances 610 are as close to the maximum uncut gate size as possible. For example, if each row of cut-gate cell instances 610 is 1 µm tall, and the maximum uncut gate size is 100.5 µm, each row of breaker cell instances 620 would be placed between every hundred rows of cut-gate cell instances 610 so that the gate strips are 100 µm long.

In practice, the addition of breaker rows increases the size of a cell block 600 by less than one percent. However, a cut-gate cell instance with cut gate features at both cell boundaries can be five to ten percent shorter than the conventional cells of FIGS. 4A and 4B. As a result, the cell block 600 configuration in FIG. 6A decreases the size of the cell block 600 by four to nine percent without sacrificing the size of the transistors in the rows of cut-gate cell instances 610. Alternatively, the size of the transistors in the rows of cut-gate cell instances 610 can be made five to ten percent larger while only increasing the overall size of the cell block 600 by less than one percent.

In one embodiment, the breaker cell instances may be viewed as filler cells that serve no purpose other than to break up the large gate strips of the cut-gate cell instances. In other embodiments the breaker cell instances may provide useful functionality. For example, the breaker cell instances may be metal programmable cells for implementing metal only engineering changes. The breaker cell instances may be decoupling capacitor cells that connect VDD to VSS to increase the stability of the power rails. The breaker cell instances may be tap cells that prevent a latch-up condition from occurring. The breaker cell instances may also implement a logic function (e.g., NAND, NOR, etc).

Figure 6B:
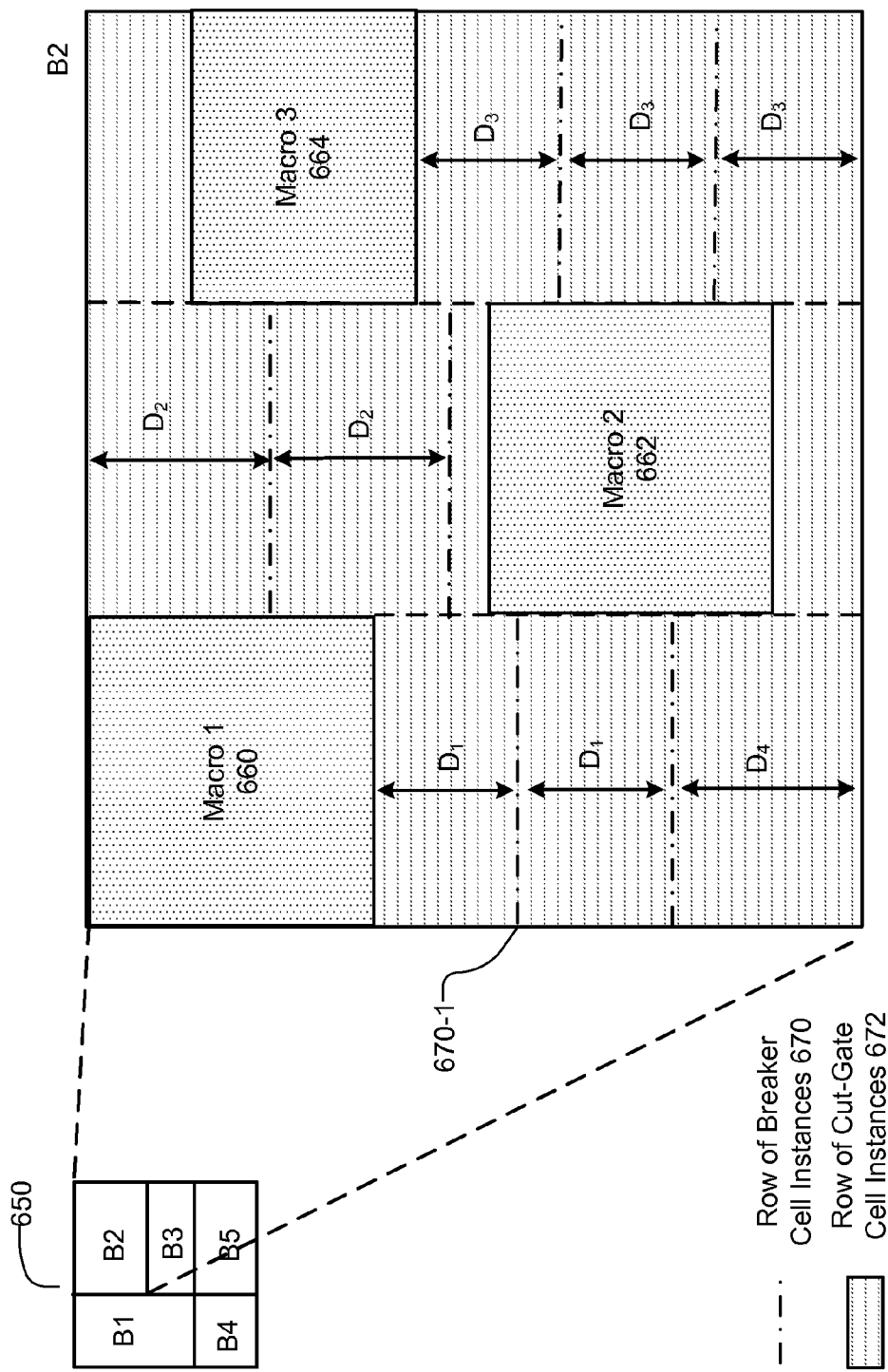
FIG. 6B illustrates one embodiment of a standard cell configuration including standard cells and cell macros in a block of an integrated circuit.

FIG. 6B illustrates one embodiment of a standard cell configuration including standard cells and cell macros in block B2 within an IC 650. ICs may be designed in blocks to facilitate the process of designing an IC. As shown, an IC 650 is divided into five smaller blocks B1, B2, B3, B4 and B5. In other embodiments there may be more or less than five blocks. The design of the IC 650 may be performed on a block-by-block basis to include the functionality needed in the IC 650, and to increase the overall utilization of space available in the IC 650.

Some blocks include macros (e.g., 660, 662, 664) in addition to standard cells. Macros are pre-defined circuit elements that implement one or more pre-defined functionalities. For example, macro 660 may represent a multiplexer, arithmetic logic unit (ALU), phase-lock loop (PLL), memory, etc. Macros are pre-designed and generally do not require modification of their internal designs when placed within an IC.

When designing a block that includes one or more macros, the space utilization in the block can be increased by minimizing the use of breaker cells. One way of minimizing the use of the breaker cells is to divide up the block into multiple regions depending on the placement of macros. Then, rows of breaker cell instances may be placed at different locations based on the position of the macros. The breaker rows may be distributed in any manner so long as the maximum uncut gate size is not exceeded.

Block B2 of FIG. 6B illustrates such an example. Block B2 includes several macros (e.g., 660, 662, 664). The space in the block B2 that is not filled by the macros is filled with rows of cut-gate cell instances 672 and rows of breaker cell instances 670. Each row of cut-gate cell instances 672 or breaker cell instances 670 comprises one or more cell instances. The cell instances in one row may or may not be the same width as the cell instances in rows that are above or below that row, so long as the gates of the cell instances in the different rows are collinear. Rows of breaker cell instances 670 are spaced at distances (e.g., $D_1, D_2, D_3, D_4$) that are less than or equal to the maximum uncut gate size to break up any large gate strips (not shown) in the rows of cut-gate cell instances 672. The distance between the rows of breaker cell instances 670 along a single vertical column may or may not be uniform (e.g., $D_1$ vs $D_4$). Similarly, the distance between rows of breaker cell instances 670 in different columns may or may not be uniform. For example, distance $D_1$ may not be the same as distance $D_2$. Further, the rows of breaker cell instances 670 may or may not extend across the entire block B2. For example, row 670-1 only extends from the left edge of the block B2 to the left edge of macro 662.

When determining the layout of a block, an iterative process may be adopted to place one or more macros at certain locations, determine the placement of cut-gate cell instances 672 and the breaker cell instances 670, and then modify the placements until a desired efficiency of space usage is achieved. In one embodiment, an optimization algorithm is used to determine the locations of macros and placement of cut-gate cell instances 672 and the breaker cell instances 670 within a block.

Method of Operation

Figure 7:
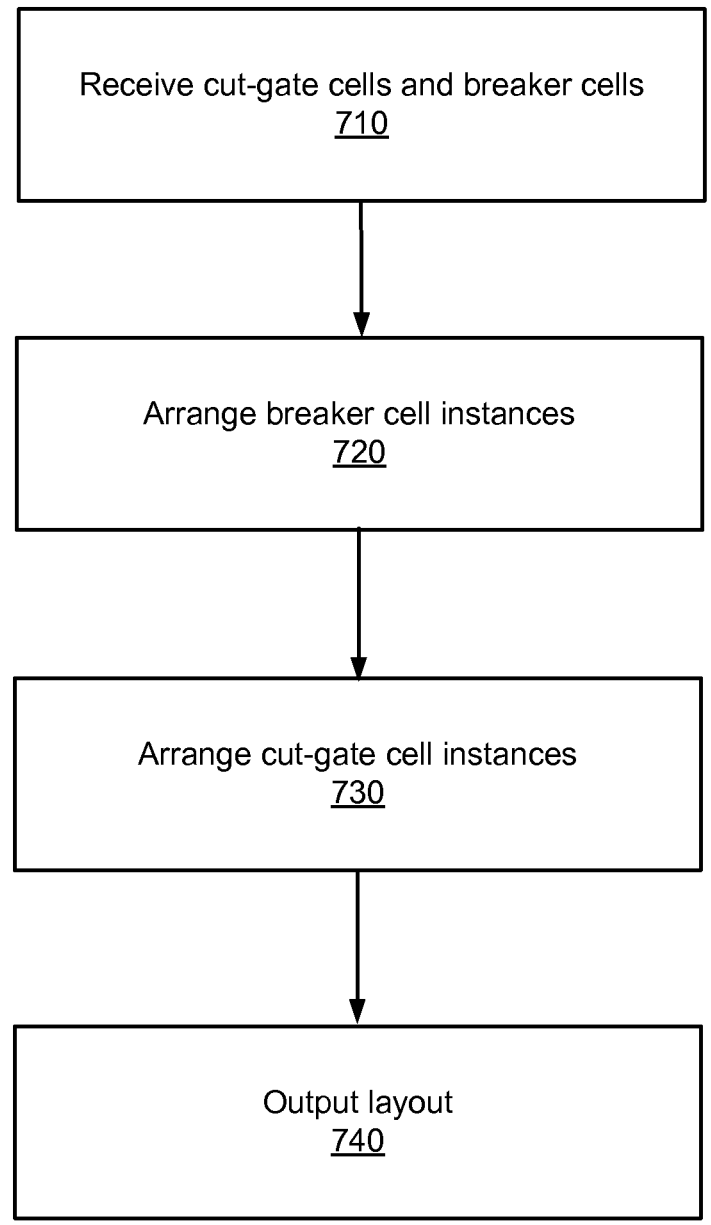
FIG. 7 is one embodiment of a method for generating a layout for an integrated circuit.

FIG. 7 is one embodiment of a method for generating a layout (i.e. representation of) for an IC. In one embodiment, the method is performed by the EDA software 212 during design planning 222 or physical implementation 224. In one embodiment of the method, the EDA software 212 receives 710 cut-gate cells and breaker cells. For example, the cells may be stored in a computer readable medium of computer 100 as part of one or more standard cell libraries and loaded into memory by the EDA software 212, or the cells may be retrieved by the EDA software 212 from another computer 100 over a network. In some embodiments, the cut-gate cells and breaker cells are part of the same cell library that is designed for a particular manufacturing process, whereas in other embodiments, the cut-gate cells and breaker cells are a part of separate cell libraries (e.g., a cut-gate cell library and a breaker cell library).

The EDA software 212 generates a layout for a block of an IC by arranging 720 instances of the breaker cells into rows of breaker cells and arranging instances of 730 the cut-gate cells into rows of cut-gate cells. In one embodiment, the rows of breaker cells and the rows of cut-gate cells are arranged in a configuration similar to the cell blocks in FIG. 5, FIG. 6A or FIG. 6B. For example, rows of breaker cells may spaced at distances that are less than or equal to the maximum uncut gate size. Rows of cut-gate cells are placed between, above, and below the rows of breaker cells so that large gate strips are formed to extend across adjacent and abutting rows of cut-gate cells. In another embodiment, the cell block may include one or more macros, as shown in FIG. 6B. When the cell block includes macros, the EDA software 212 may first place the macros. The EDA software 212 then arranges 720 the breaker cells into rows based on the locations of the macros in the block.

The layout of the cell block is then output 730, which can include storing the layout to a non-transitory computer readable medium or providing the layout to another stage of an EDA design flow. In one embodiment, the layout of the IC can be provided to a foundry that fabricates the IC by forming the gates in the layout and cutting the gates at the locations of the cut-gate features.

Figure 8:
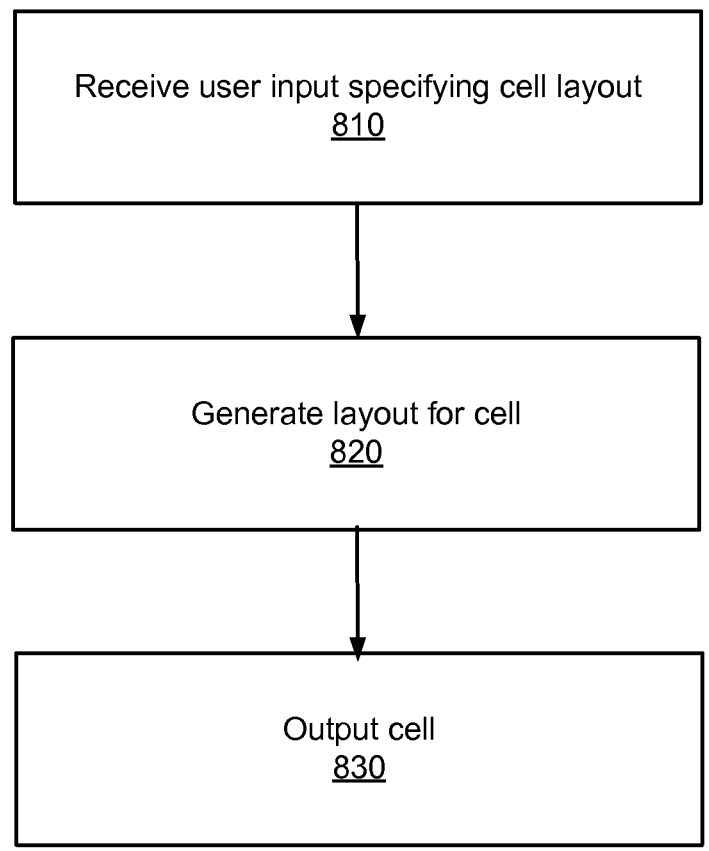
FIG. 8 is one embodiment of a method for creating a library of cells.

FIG. 8 is one embodiment of a method for creating a library of cells. The method may be performed, for example, by an interactive software tool that is used by a cell designer to create a library of cells. In one embodiment, the tool receives 810 receives a user input specifying a layout for a cell, such as a cut-gate cell or breaker cell. The user input may specify the shape and location of objects in the cell (e.g., cell boundary, gate sizes, diffusion sizes, cut-gate features). In response to the user input, the tool generates 820 a layout for the cell. In one embodiment, the generated cells have layouts that resemble the cut-gate cells and breaker cells from FIG. 5. The tool then outputs 820 the cells, for example, by storing the cells to disk as part of one or more cell libraries.

Additional Configuration Considerations

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

The various operations of example methods described herein, such as those performed by the compiler, may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

Similarly, the methods described herein may be at least partially processor-implemented. For example, at least some of the operations of a method may be performed by one or processors or processor-implemented hardware modules. The performance of certain of the operations may be distributed among the one or more processors, not only residing within a single machine, but deployed across a number of machines. In some example embodiments, the processor or processors may be located in a single location (e.g., within a home environment, an office environment or as a server farm), while in other embodiments the processors may be distributed across a number of locations.

The one or more processors may also operate to support performance of the relevant operations in a "cloud computing" environment or as a "software as a service" (SaaS). For example, at least some of the operations may be performed by a group of computers (as examples of machines including processors), these operations being accessible via a network (e.g., the Internet) and via one or more appropriate interfaces (e.g., application program interfaces (APIs).)

The performance of certain of the operations may be distributed among the one or more processors, not only residing within a single machine, but deployed across a number of machines. In some example embodiments, the one or more processors or processor-implemented modules may be located in a single geographic location (e.g., within a home environment, an office environment, or a server farm). In other example embodiments, the one or more processors or processor-implemented modules may be distributed across a number of geographic locations.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to improve the clarity of this disclosure. This description should be read to include one or at least one and the singular also includes the plural unless it is obvious that it is meant otherwise.

Upon reading this disclosure, those of skill in the art will appreciate still additional alternative structural and functional designs for a cell architecture for increasing transistor size through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. An integrated circuit (IC) fabricated from a representation of the IC, the representation comprising:
   a first plurality of adjacent cell instances, a first gate strip formed by the first plurality of adjacent cell instances and extending continuously across the first plurality of adjacent cell instances, each cell instance in the first plurality of adjacent cell instances having cut gate features located along opposing boundaries of the cell instance to indicate locations for cutting the first gate strip during fabrication of the IC;
   a breaker cell instance that includes a gate, wherein both ends of the gate are located within an interior of the breaker cell instance and offset from boundaries of the breaker cell instance; and
   a second plurality of adjacent cell instances, a second gate strip formed by the second plurality of adjacent cell instances and extending continuously across the second plurality of adjacent cell instances, each cell instance in the second plurality of adjacent cell instances having cut gate features located along opposing boundaries of the cell instance to indicate locations for cutting the second gate strip during fabrication of the IC,
   wherein the first gate strip, the gate of the breaker cell instance, and the second gate strip are collinear, and the gate of the breaker cell instance is separated from and located between the first gate strip and second gate strip.

2. The IC of claim 1, wherein the first plurality of adjacent cell instances, the breaker cell instance, and the second plurality of adjacent cell instances are placed into abutting rows of the representation of the IC.

3. The IC of claim 1, wherein each cell instance in the first plurality of adjacent cell instances and the breaker cell instance have a same height.

4. An integrated circuit (IC) fabricated from a representation of the IC, the representation comprising:
   a first plurality of adjacent cell instances, a first gate strip formed by the first plurality of adjacent cell instances and extending continuously across the first plurality of adjacent cell instances, each cell instance in the first plurality of adjacent cell instances having cut gate features located along opposing boundaries of the cell instance to indicate locations for cutting the first gate strip during fabrication of the IC; and a breaker cell instance that includes a gate, wherein both ends of the gate are located within an interior of the breaker cell instance and offset from boundaries of the breaker cell instance; and wherein the gate of the breaker cell instance is collinear with and separated from the first gate strip.

5. The IC of claim 4, wherein the representation further comprises:

a second plurality of adjacent cell instances, a second gate strip formed by the second plurality of adjacent cell instances and extending continuously across the second plurality of cell instances, each cell instance in the second plurality of adjacent cell instances having cut gate features located along opposing boundaries of the cell instance to indicate locations for cutting the second gate strip during fabrication of the IC, wherein the first gate strip, the gate of the breaker cell instance, and the second gate strip are collinear, and the gate of the breaker cell instance is separated from and located between the first gate strip and second gate strip.

6. The IC of claim 4, wherein the first plurality of adjacent cell instances and the breaker cell instance are placed into abutting rows of the representation of the IC.

7. The IC of claim 4, wherein each cell instance in the first plurality of adjacent cell instances and the breaker cell instance have a same height.

8. The IC of claim 4, wherein the first plurality of adjacent cell instances comprise instances of a plurality of cell types representing different logic functions.

9. The IC of claim 4, wherein the first plurality of adjacent cell instances and the breaker cell instances have a same gate pitch.

10. The IC of claim 4, wherein the breaker cell instance represents at least one of a metal programmable cell, a decoupling capacitor cell, a tap cell or a logic cell.

11. A non-transitory machine readable medium storing a representation of an integrated circuit (IC), the representation comprising:

a first plurality of adjacent cell instances, a first gate strip formed by the first plurality of adjacent cell instances and extending continuously across the first plurality of adjacent cell instances, each cell instance in the first plurality of adjacent cell instances having cut gate features located along opposing boundaries of the cell instance to indicate locations for cutting the first gate strip during fabrication of the IC; and a breaker cell instance that includes a gate, wherein both ends of the gate are located within an interior of the breaker cell instance and offset from boundaries of the breaker cell instance; and wherein the gate of the breaker cell instance is collinear with and separated from the first gate strip.

12. The machine readable medium of claim 11, wherein the representation further comprises:

a second plurality of adjacent cell instances, a second gate strip formed by the second plurality of adjacent cell instances and extending continuously across the second plurality of adjacent cell instances, each cell instance in the second plurality of adjacent cell instances having cut gate features located along opposing boundaries of the cell instance to indicate locations for cutting the second gate strip during fabrication of the IC, wherein the first gate strip, the gate of the breaker cell instance, and the second gate strip are collinear, and the gate of the breaker cell instance is separated from and located between the first gate strip and second gate strip.

13. The machine readable medium of claim 11, wherein the first plurality of adjacent cell instances and the breaker cell instance are placed into abutting rows of the representation of the IC.

14. The machine readable medium of claim 11, wherein each cell instance in the first plurality of adjacent cell instances and the breaker cell instance have a same height.

15. The machine readable medium of claim 11, wherein the first plurality of adjacent cell instances comprise instances of a plurality of cell types representing different logic functions.

16. The machine readable medium of claim 11, wherein the first plurality of adjacent cell instances and the breaker cell instances have a same gate pitch.

17. The machine readable medium of claim 11, wherein the breaker cell instance represents at least one of a metal programmable cell, a decoupling capacitor cell, a tap cell or a logic cell.

18. A computer-implemented method for generating a representation of an integrated circuit (IC), comprising:

arranging a breaker cell instance into the representation, the breaker cell instance having a gate, wherein both ends of the gate are located within an interior of the breaker cell instance and offset from boundaries of the breaker cell instance; and arranging, by a computer, a first plurality of adjacent cell instances into the representation, a first gate strip formed by the first plurality of adjacent cell instances and extending continuously across the first plurality of adjacent cell instances, the first gate strip collinear with and separated from the gate of the breaker cell instance, each cell instance in the first plurality of adjacent cell instances having cut gate features located along opposing boundaries of the cell instance to indicate locations for cutting the first gate strip during fabrication of the IC.

19. The method of claim 18, further comprising:

arranging a second plurality of adjacent cell instances into the representation, a second gate strip formed by the second plurality of adjacent cell instances and extending continuously across the second plurality of adjacent cell instances, the second gate strip collinear with and separated from the gate of the breaker cell instance, each cell instance in the second plurality of adjacent cell instances having cut gate features located along opposing boundaries of the cell instance to indicate locations for cutting the second gate strip during fabrication of the IC, wherein the gate of the breaker cell instance is located between the first and second gate strips.

20. The method of claim 18, wherein arranging the first plurality of adjacent cell instances into the representation comprises arranging instances of a plurality of cell types representing different logic functions into the representation.

21. The method of claim 18, wherein the first plurality of adjacent cell instances and the breaker cell instance are arranged into abutting rows in the representation.

22. A non-transitory machine readable medium storing at least one cell library for designing an integrated circuit (IC), the at least one cell library comprising:

a plurality of first cells, each first cell including a gate extending at least from a first boundary of the cell to a second boundary of the cell that is opposite to the first boundary, the first cell including cut gate features located along the first and second cell boundaries to indicate locations for cutting the gate during fabrication of the IC; and a breaker cell including a gate, wherein both ends of the gate are located within an interior of the breaker cell and offset from boundaries of the breaker cell.

23. The machine readable medium of claim 22, wherein each of the first cells and breaker cell have a same height.

24. The machine readable medium of claim 22, wherein the plurality of first cells and the breaker cell instances have a same gate pitch.

25. The machine readable medium of claim 22, wherein the breaker cell represents at least one of a metal programmable cell, a decoupling capacitor cell, a tap cell or a logic cell.

* * * * *